(12) United States Patent
Gasparik et al.

(10) Patent No.: US 7,456,498 B2
(45) Date of Patent: Nov. 25, 2008

(54) INTEGRATED CIRCUIT PACKAGE AND SYSTEM INTERFACE

(75) Inventors: Frantisek Gasparik, Monument, CO (US); Steve Callicott, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 151 days.

(21) Appl. No.: 11/506,680

(22) Filed: Aug. 18, 2006

(65) Prior Publication Data

US 2008/0042267 A1 Feb. 21, 2008

(51) Int. Cl.
*H01L 23/10* (2006.01)
*H01L 23/34* (2006.01)

(52) U.S. Cl. .............. 257/706; 257/707; 257/728; 257/E23.08; 257/E23.101

(58) Field of Classification Search ......... 257/706, 257/707, 728, E23.08, E23.101
See application file for complete search history.

(56) References Cited

U.S. PATENT DOCUMENTS

| | | | |
|---|---|---|---|
| 6,346,679 B1 | 2/2002 | Nakamura | 174/260 |
| 6,603,205 B2 | 8/2003 | Miura | 257/762 |
| 6,657,292 B2 | 12/2003 | Watanabe | 257/697 |
| 2002/0125042 A1 | 9/2002 | Hacke et al. | 174/260 |
| 2003/0230798 A1* | 12/2003 | Lin et al. | 257/704 |
| 2006/0063309 A1* | 3/2006 | Sugiyama et al. | 438/118 |
| 2006/0113681 A1* | 6/2006 | Jeong et al. | 257/780 |
| 2006/0138630 A1 | 6/2006 | Bhakta | 257/686 |
| 2006/0138649 A1 | 6/2006 | Karnezos | 257/723 |

* cited by examiner

*Primary Examiner*—Ngan Ngo
(74) *Attorney, Agent, or Firm*—Ortiz & Lopez PLLC; Luis M. Ortiz; Kermit D. Lopez

(57) ABSTRACT

A method for enhancing the performance of an IC package and media interface. Adding a fissure to a Flip-Chip type package improves the crosstalk performance of the package for both high and low frequencies. The wall of the fissure can be implemented with a heat spreader layer and can be connected to any AC ground such as VSS or VDD package planes. The fissures can also accommodate the ingress of an optical fiber, which allows for a direct interface with the transceivers. The direct optical fiber interface permits the removal of solder balls for high speed signal traces, with their respective vias. On-chip integrated LEDs or other similar light source transceivers can drive the high speed signal media. Selective deposition of low dielectric material can also improve the frequency response of high speed signal package traces.

12 Claims, 12 Drawing Sheets

INTEGRATED CIRCUIT PACKAGE AND SYSTEM INTERFACE

TECHNICAL FIELD

Embodiments are generally related to data transmission devices and systems. Embodiments are also related to Integrated Circuit (IC) packages and system interfaces. Embodiments are additionally related to methods for enhancing the performance and to extend the frequency range of IC packages and system interfaces.

BACKGROUND OF THE INVENTION

Consumer demand for increased mobility, wireless connectivity and advanced features have paved the way for a variety of new products including advanced mobile handsets, PDAs (Personal Digital Assistants), digital cameras and camcorders, portable music players and many other such devices. Silicon-based solutions driving these products are more highly integrated than ever before, as advancements in process technology have resulting in the delivery of System-on-a-Chip (SoC) solutions that are smaller, faster and increasingly inexpensive. These trends, along with a broad range of emerging end equipment, require a large diversity of new IC package types to meet specific applications or markets. Increased device complexity can generate an explosion of new creative and disruptive technology packaging solutions and in some markets and applications packaging technology is a key differentiator when making purchasing decisions.

Small Computer System Interface (SCSI), a parallel interface standard for attaching peripheral devices to computers has achieved a remarkable 320 Mbps data rate. Many new transmission technologies such as Ethernet, Serial Attached SCSI (SAS), Serial Advanced Technology Attachment (SATA), and Fiber Channel (FC) have bit rates in excess of 5 Gbps. A typical channel in all of the mentioned protocols contains Signal Source IC (i.e., Integrated circuit with driver receiver or transceiver), IC package enclosure (e.g., Ball-Grid-Array, Flip-Chip, Quad Flat Package, etc.), Printed Circuit Board (PCB) with a connector interface to transmission media, and transmission media (e.g., copper or fiber optic cable).

The overall system throughput can be determined by the component with the narrowest bandwidth. Historically, the weakest link was the IC transceiver, due to the speed limitation of the silicon and gallium arsenide manufacturing technology. As the CMOS process pushes the speed envelope toward the 10 Gbps arena, other system components are subject to speed limiting hurdles. Package enclosures, mother boards and media interface connectors are becoming the performance limits for all systems above the 10 Gbps data transmission range.

Integrated circuits (IC's) typically constitute devices such as transistors and diodes and elements, such as resistors and capacitors, linked together by conductive connections to form one or more functional circuits. IC's are typically formed in a rectangular piece of silicon referred to as a "chip" or a "die". Silicon dice can be formed in a wafer of silicon. A wafer is a sheet of silicon with a surface that is subject to a series of fabrication steps to form a pattern of identical IC's. The IC's are generally separated from each other by a repeating rectangular pattern of scribe lines, also called "saw" lines located in the surface of the wafer that serve as boundaries between the dice. A single IC can be formed in each die. At a late stage in a fabrication process, the dice are typically diced (i.e., cut apart) from the wafer along the scribe lines and each die is then bonded to a substrate to form an IC package.

Presently, the most popular IC package enclosure is the Ball-Grid-Array (BGA) package. The popularity of BGA arrangements is largely due to the large number of pins (e.g., exceeding 1,000 counts), small foot-print, low cost, reliability, and bandwidth adequate for present data rates well below 10 Gbps. Referring to FIG. 1, a pictorial view of a prior art BGA package 100 is illustrated, which is a popular surface mount chip package that utilizes a grid of solder balls 160 as its connectors. High-speed data signals enter the BGA package 100 through input ports 120 located on the left side of FIG. 1, by means of bondwires 110. IC transceivers are connected by bond wires 110 to the package posts 130. From the package posts 130, the signal flows through a package trace 170, a respective via 140 and then exits the package at the solder ball 160. The package traces 170 continue beyond the vias 140 toward the edge of the BGA package 100. These extended trace sections are known as "stubs". Any signal trace shape change from the rectangular form and direction change from the straight line, can affect on trace characteristic impedance and attenuation.

The bondwires 110, with their circular cross-section, insert variability into the signal propagation (i.e., attenuation and reflection). The vias 140 add another discontinuity to the desired transmission line uniformity, with their self-resonance effect. And finally, the solder balls 160 represent still another non-uniform shape and self-resonance. All such discontinuities result in signal attenuation and reflections and destroy the signal integrity. Equally detrimental to the signal integrity is the cross-talk, which is due to undesirable signal coupling from the adjacent package traces 170. BGA crosstalk is primarily caused by bondwires 110 and package signal traces 170. Bondwires 110 and signal traces 170 lengths are comparable and cannot be further reduced to minimize the amount of crosstalk. The IC die size can cause additional variability of the wirebond lengths. The effects of the solder ball 160 and via 140 resonances can show up both in attenuation and the crosstalk frequency response.

Referring to FIG. 2, a prior art graphical representation of a crosstalk response 150 into signal trace 23 of BGA package 100 is illustrated. Signal trace 23 is the victim trace. From the aggressor traces 17 and 18, the crosstalk is generally −12 dB at 6 GHz as indicated in FIG. 2. It means that one fourth of the aggressor's transmitted signal with the third harmonic component of 6 GHz can appear in the adjacent signal trace 23. This precludes the use of BGA package for any data transmission systems with a data rate above 4 Gbps.

Referring to FIG. 3, another prior art graphical representation of a crosstalk performance 200 of BGA package 100 is illustrated. Here the crosstalk is generally in the range of −6 dB, as indicated in FIG. 3, meaning that one half of the aggressor's signal can be coupled into the victim package trace 170 as shown in FIG. 1. For a typical differential drive magnitude of 1 Vpk, the coupled crosstalk would be 500 mVpk. This is clearly unacceptable for all known data transmission standards.

Referring to FIG. 4, a pictorial view of a prior art Flip-Chip package 250 is illustrated. Flip Chip (FC) is not a specific package (such as SOIC), or even a package-type (like BGA) device. The term "Flip Chip" generally refers to the method of electrically connecting a die to a package carrier. In contrast, the interconnection between the die and carrier in flip chip packaging is configured through a conductive "bump" that is placed directly on the die surface. The FC package 250 depicted in FIG. 4 does not possess any bond wires, such as, for example, the bond wires 110 shown in FIG. 1. The FC package 250 is instead directly connected to an IC chip by means of solder bumps 410. The Flip-Chip package crosstalk is exemplified by signal traces 420. For high density Flip-Chip packages, the length of parallel trace coincidence can be excessive. Layout separation is sometimes difficult to achieve, and the advantage of the FC package 250 is lost in comparison with BGA package 100 described earlier. Solder bumps 410, solder balls 160 and vias 140 represent additional impedance mismatches in the transmission line, which can lead to signal reflections and further negative effects on the signal integrity.

Referring to FIG. 5, a prior art graphical representation of the crosstalk performance of FC package 250 depicted in FIG. 4 is illustrated. FC package 250 has an improved crosstalk performance in comparison to the BGA package 100 of approximately −18 dB. The solder bumps 410 solder balls 160 and vias 160 illustrated in FIG. 4 can cause local extremes in frequency responses. Their removal in new packages will further improve the attenuation and crosstalk performance.

In an effort to address the foregoing difficulties, a fissure can be added to the Flip-Chip type of package that significantly improves the crosstalk performance of the package for both high and low frequencies by 70 db and 32 dB respectively, up to 20 Gbps data rates. The fissure can be connected to any AC ground such as VSS or VDD package planes. The fissure can also accommodate the ingress of an optical fiber, which can allow the removal of the solder balls for high speed signal traces, with their respective vias. On-chip integrated LEDs or similar light source transceivers can drive the high speed signal media. Selective deposition of low dielectric material can improve the frequency response of high speed signal package traces.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for improved data transmission systems.

It is another aspect of the present invention to provide for an improved integrated circuit package and system interface.

It is another aspect of the present invention to provide for a method for enhancing the performance and extending the frequency range of integrated circuit packages and system interfaces.

It is an additional aspect of the present invention to provide for an improved IC and system interface with novel coupling configurations.

The aforementioned aspects and other objectives and advantages can now be achieved as described herein. A method for enhancing the performance of Integrated Circuit packages and media interface is described, which includes a fissure to a Flip-Chip type package in order to improve the crosstalk performance of the package for both high and low frequencies. The wall of the fissure can be implemented utilizing a heat spreader layer and can be connected to any AC ground, such as VSS or VDD package planes.

The fissure can also accommodate the ingress of an optical fiber, which allows a direct interface with the transceivers. The direct optical fiber interface can permit the removal of solder balls for high speed signal traces, with their respective vias. On-chip integrated LED or similar light source transceivers can drive the high speed signal media. Selective deposition of low dielectric material can improve the frequency response of high speed signal package traces.

Based on the foregoing, it can be appreciated that designing high-speed analog and digital circuits for the data-communication industry is an extremely difficult task. Today, the task is especially difficult as data rates explode well beyond 1 to 40 Gbits/s. Integrated circuits, which provide the optical-to-electronic transition for these network systems, are the most difficult components to design in a fiber-optic transceiver. These optical electronic ICs (OEICs) include the laser driver, generating the electrical current to modulate the laser, and the trans-impedance amplifier, which receives a very small current from a photodiode and must amplify it with minimal noise effects. The challenge is to accurately predict the high-speed digital-signal parasitics for these optical systems. These parasitics are evaluated in the form of jitter, crosstalk, skew and ground bounce, which are generated by series inductance on the data path, substrate coupling effects at the bulk-surface level, package structure, and board-generated effects.

Digital IC designers and IC-package designers are now encountering high-frequency package limitations. Crosstalk is comprised of two sources: distributed capacitive and inductive coupling between the package signal lines, and common-ground inductance in the package. The distributed capacitive and inductive coupling, generally termed cross coupling, can be usually modeled in microwave packages as coupled transmission lines.

It is believed that careful selection of processing methods and materials can result in the successful development of production steps for FC devices in order to speed development of the final product. Additionally, a need exists to extend the frequency range of present IC packages from the current range of 5 Gbps to 20 Gbps and higher for SAS/SATA/FC components. Thus, in order to meet these continuing needs and overcome the problems described above, an improved IC and system interface with novel coupling configurations are described in detail herein.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 6:
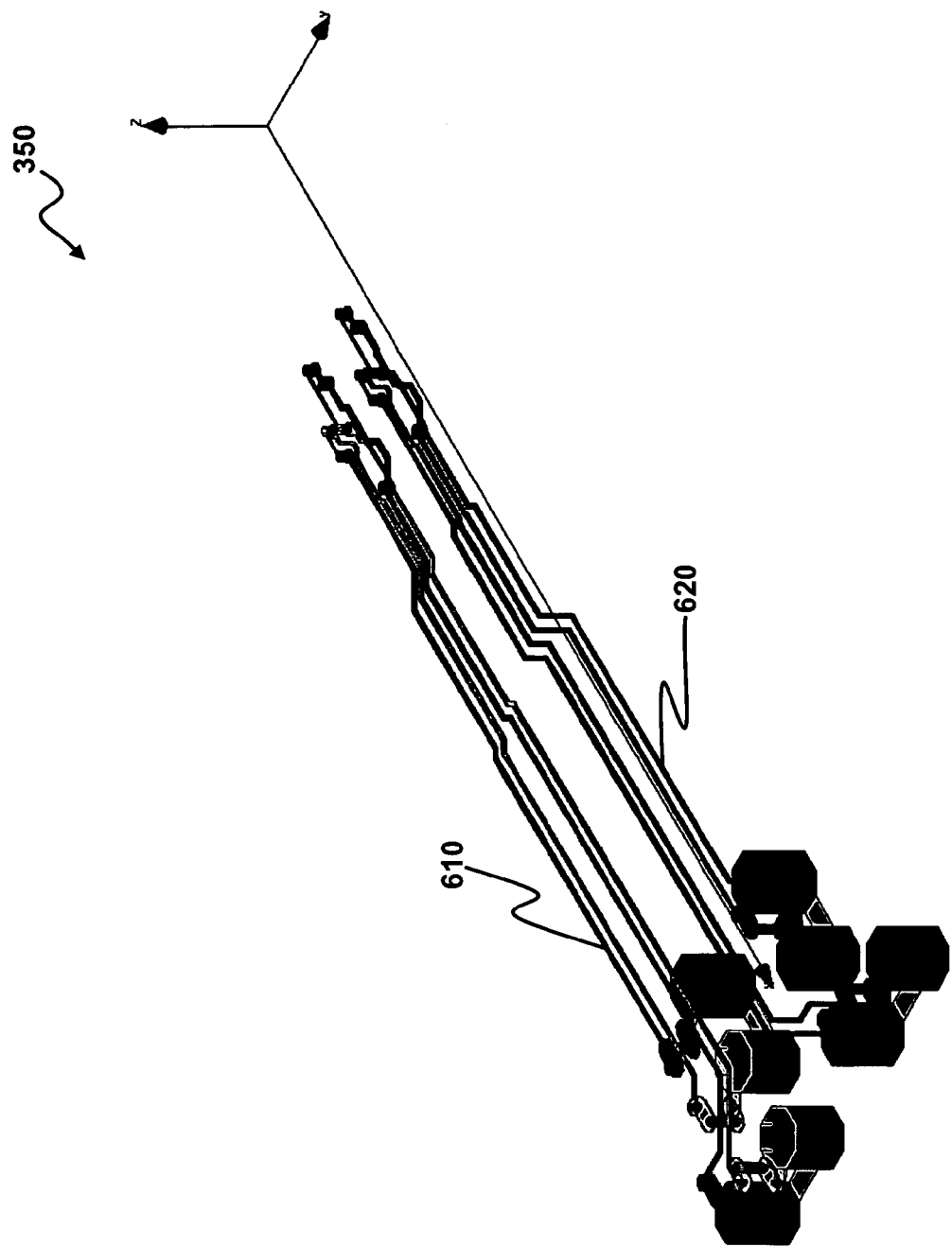
FIG. 6 illustrates a pictorial view of two signal pair traces of an IC package prior to modification in accordance with a preferred embodiment.

Referring to FIG. 6, a pictorial view of two signal pair traces of an integrated circuit package 350, prior to modification in accordance with a preferred embodiment. As illustrated in FIG. 6, four high-speed traces 610 form one transmit/receive pair. Adjacent four low speed signal traces 620 are analyzed for performance reference.

Figure 7:
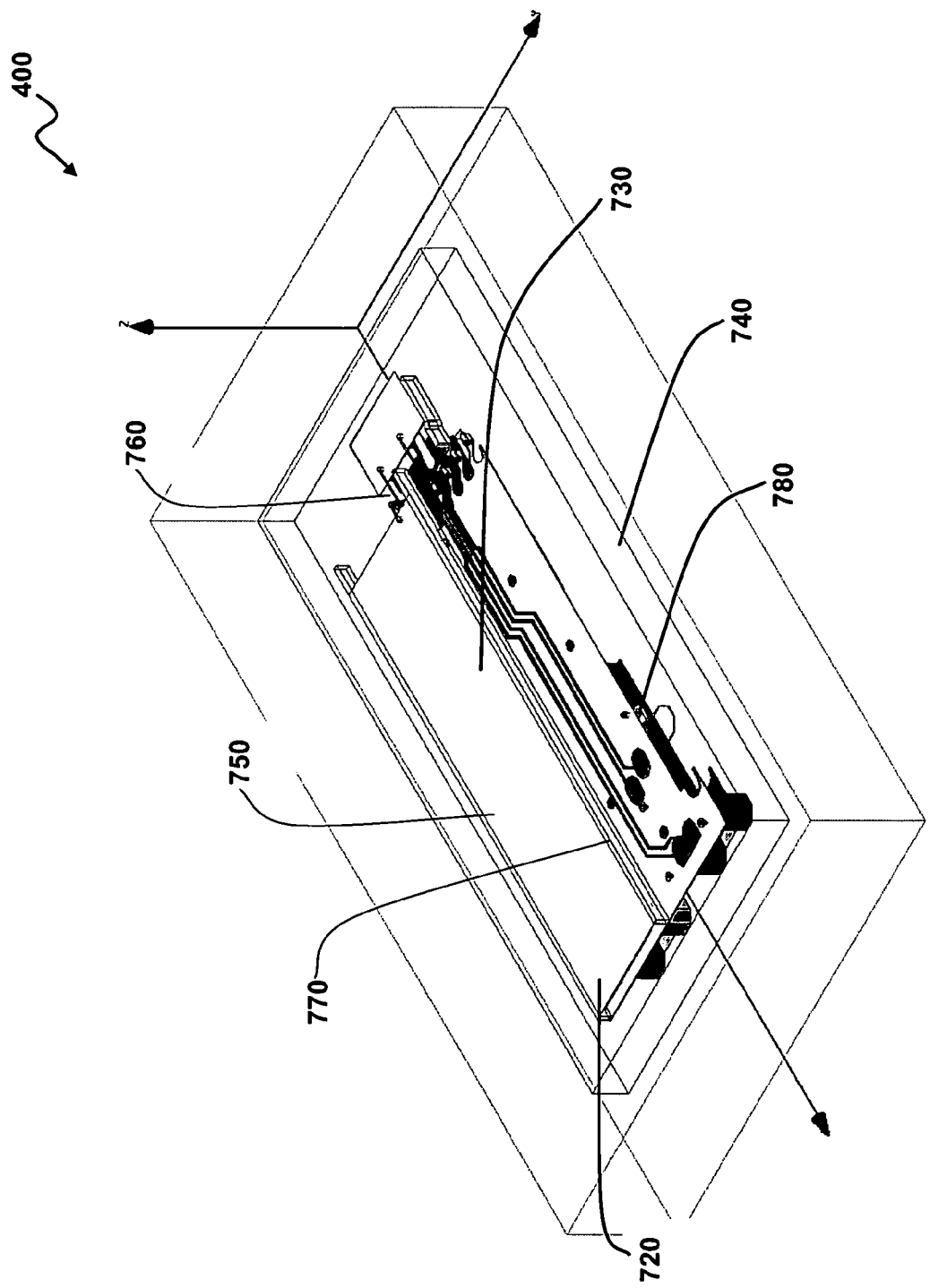
FIG. 7 illustrates a pictorial view of an improved IC package structure which can be implemented, in accordance with a preferred embodiment.

Referring to FIG. 7, a pictorial view of an improved IC package 400 is illustrated, in accordance with a preferred embodiment. Four high-speed traces 610 as shown in FIG. 6 are enclosed by a fissure 720. The fissure 720 is formed by conductive material 750 which are connected to VSS or VDD AC ground. The top of the fissure 720 can be formed by a conductive heat spreader 730 configured from a dielectric material 740 disposed in thermal contacts 760, such that one or more arrays 770 and a layer of thermally conductive material 750 are embedded in the dielectric material 740.

The improved IC package 400 can be fabricated by forming layers of electrically conductive, dielectric, and thermally conductive materials on a substrate. The layers 780 are arranged to enable heat energy given off by current-carrying communication lines to be transferred away from the communication lines. The dielectric material 740 inside the fissure 720 is of a low dielectric constant.

Figure 4:
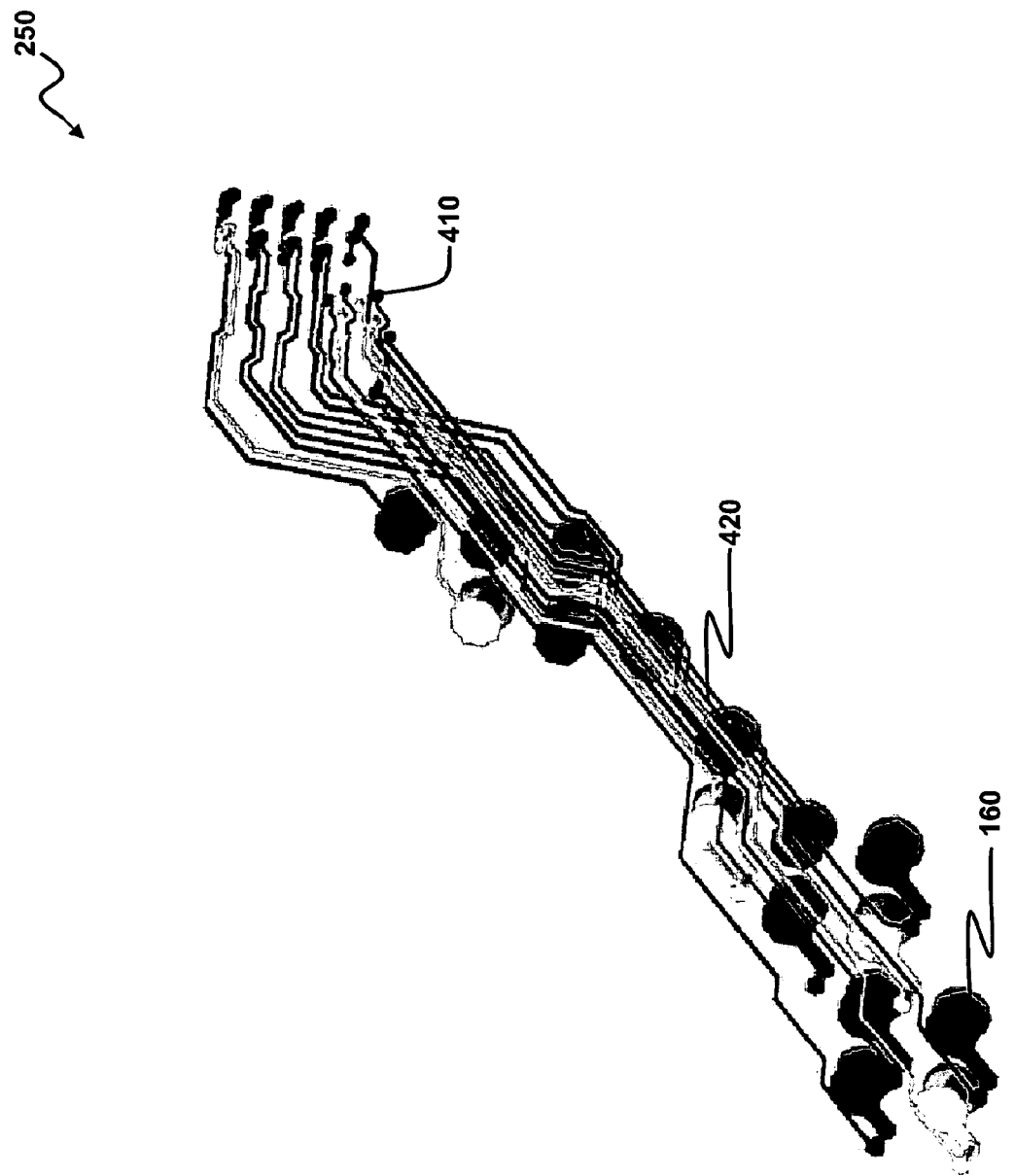
FIG. 4 illustrates a pictorial view of a prior art Flip-Chip package.
Figure 8:
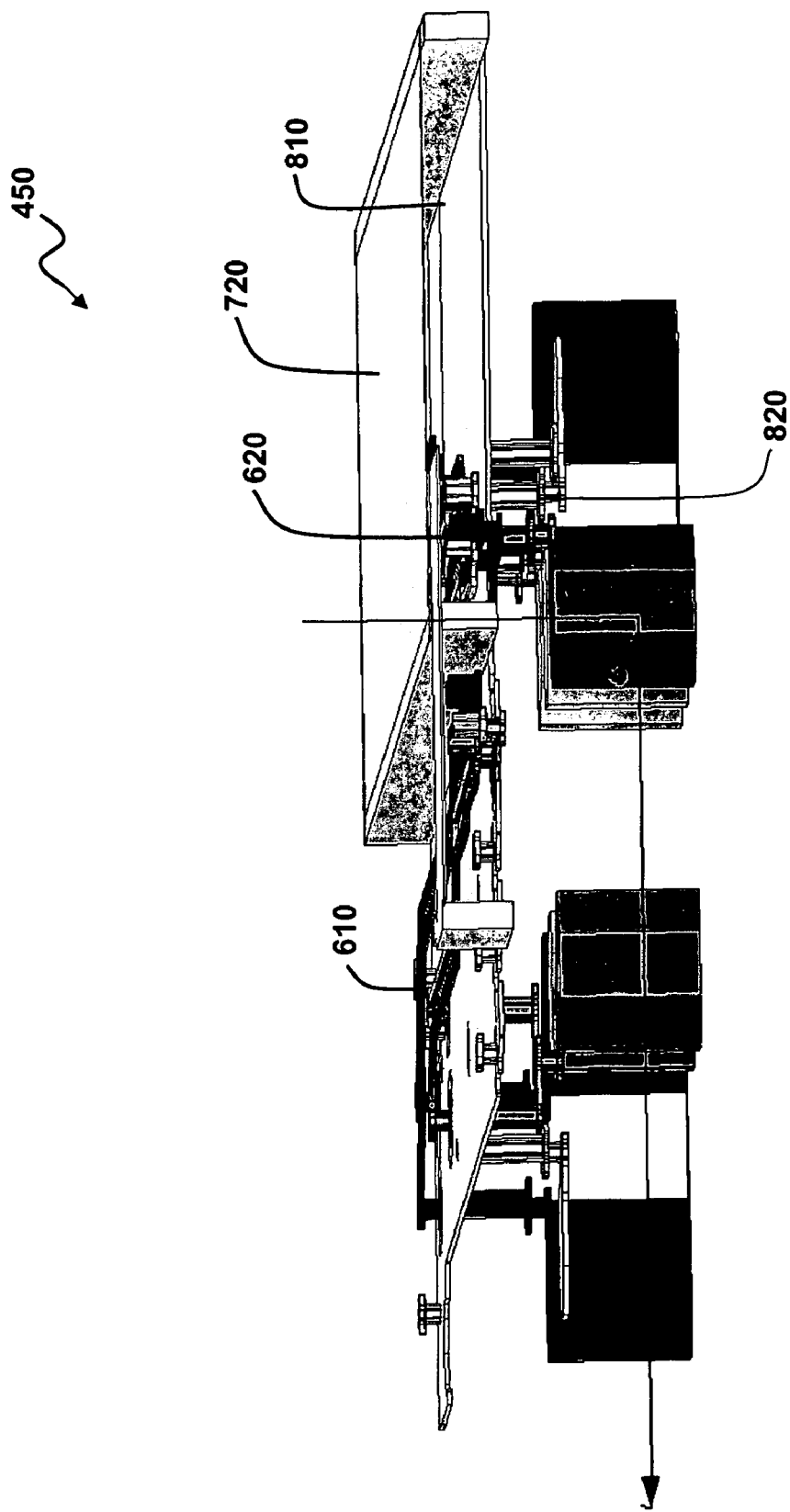
FIG. 8 illustrates a detailed view of fissure structure of new Integrated Circuit package, in accordance with a preferred embodiment.

Referring to FIG. 8, a detailed view of a fissure structure 450 of the improved IC package 400 is illustrated, in accordance with a preferred embodiment. FIG. 8 depicts in greater detail, the fissure 720 opening. Its use can be broadened to quasi-interface functions for ingress of the optic fiber interface 810 in order to directly access data transmission media. Solder bumps 410 as shown in FIG. 4 can be removed and LED light sources can be integrated on the transceiver 820. Such a configuration can remove the need for solder balls 160 for the most sensitive high-speed signal traces 610. The rest of the low-speed signal traces 620 with power/ground connections can also be preserved.

Figure 9:
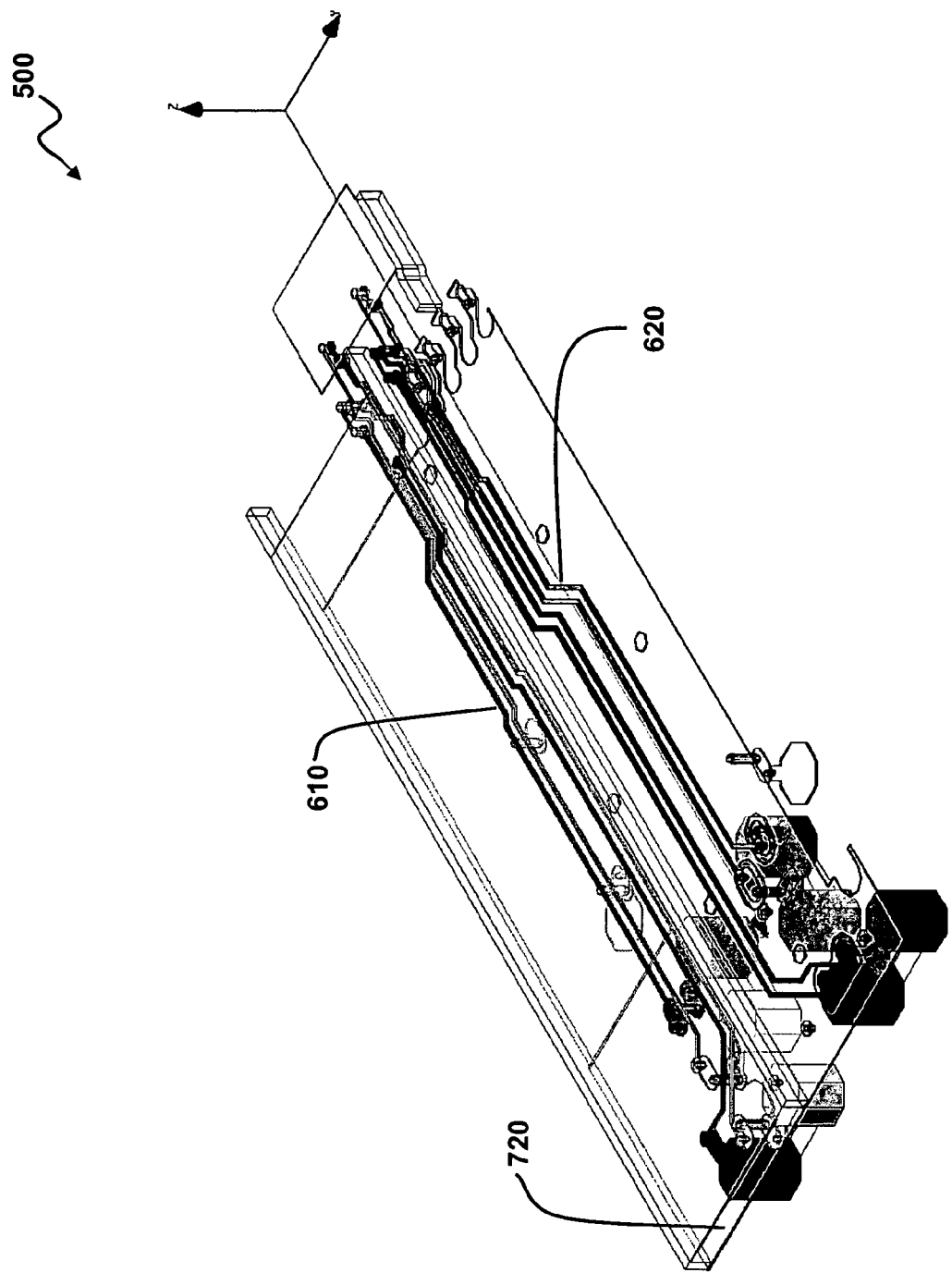
FIG. 9 illustrates a top perspective view of an improved IC package, including a transparent image of a fissure, in accordance with a preferred embodiment.

Referring to FIG. 9, a top perspective view of an improved IC package including a transparent image of fissure 500 is illustrated, in accordance with a preferred embodiment. In general, an improved package with internal trace routing and a ground plane is repeated in FIG. 9. The size and form of the fissure 720 can be adjusted to accommodate various interface functions. Four high-speed traces 610 generally form one transmit/receive pair located in the fissure 720. Adjacent four low-speed signal traces 620 can be analyzed for performance reference with respect to the high-speed signal traces 610.

Examining a number of potential new approaches can yield the disclosed concept of a full enclosure of both signal traces in a waveguide-like structure.

Figure 1:
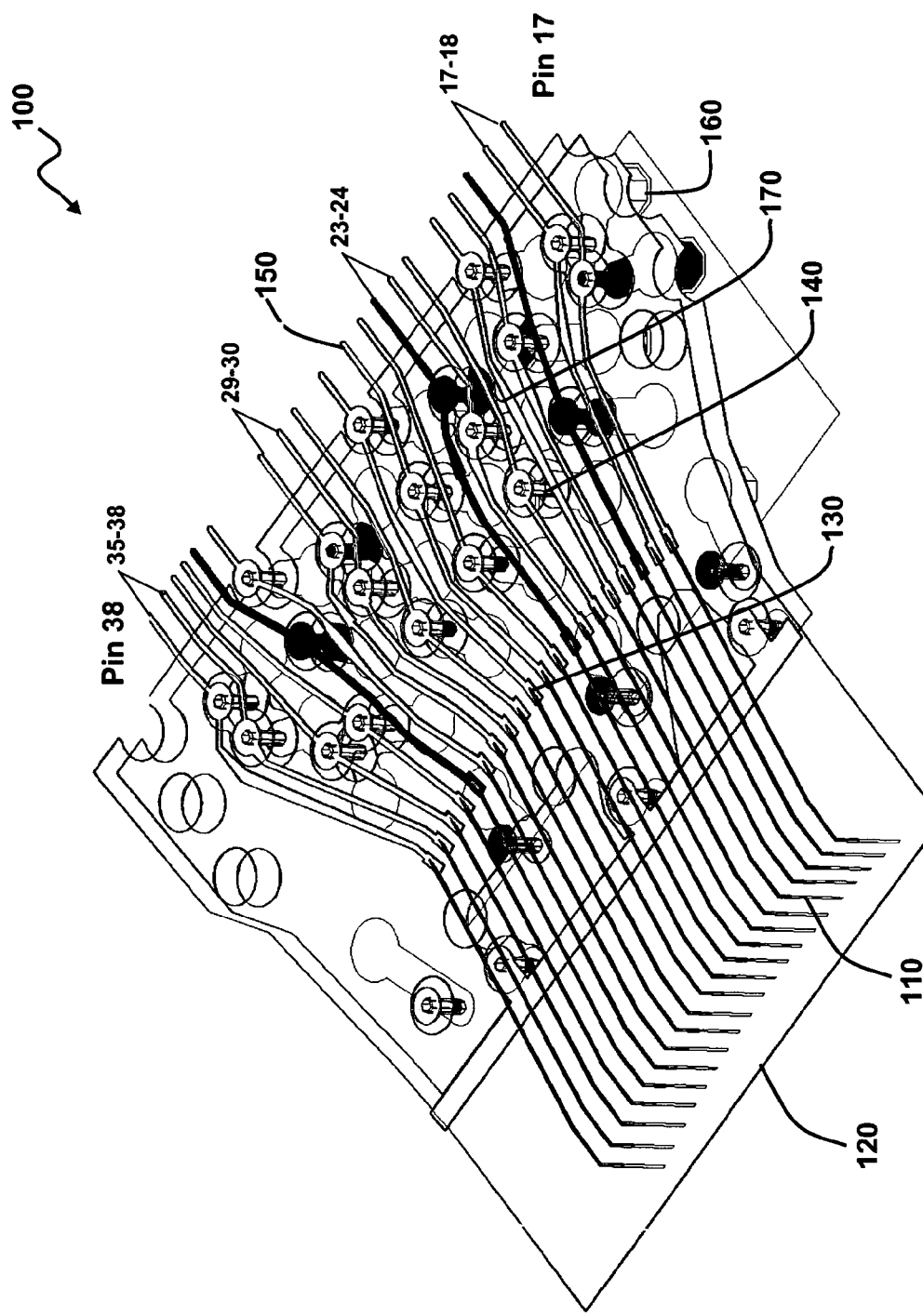
FIG. 1 illustrates a pictorial view of a prior art Ball Grid Array (BGA) package.
Figure 2:
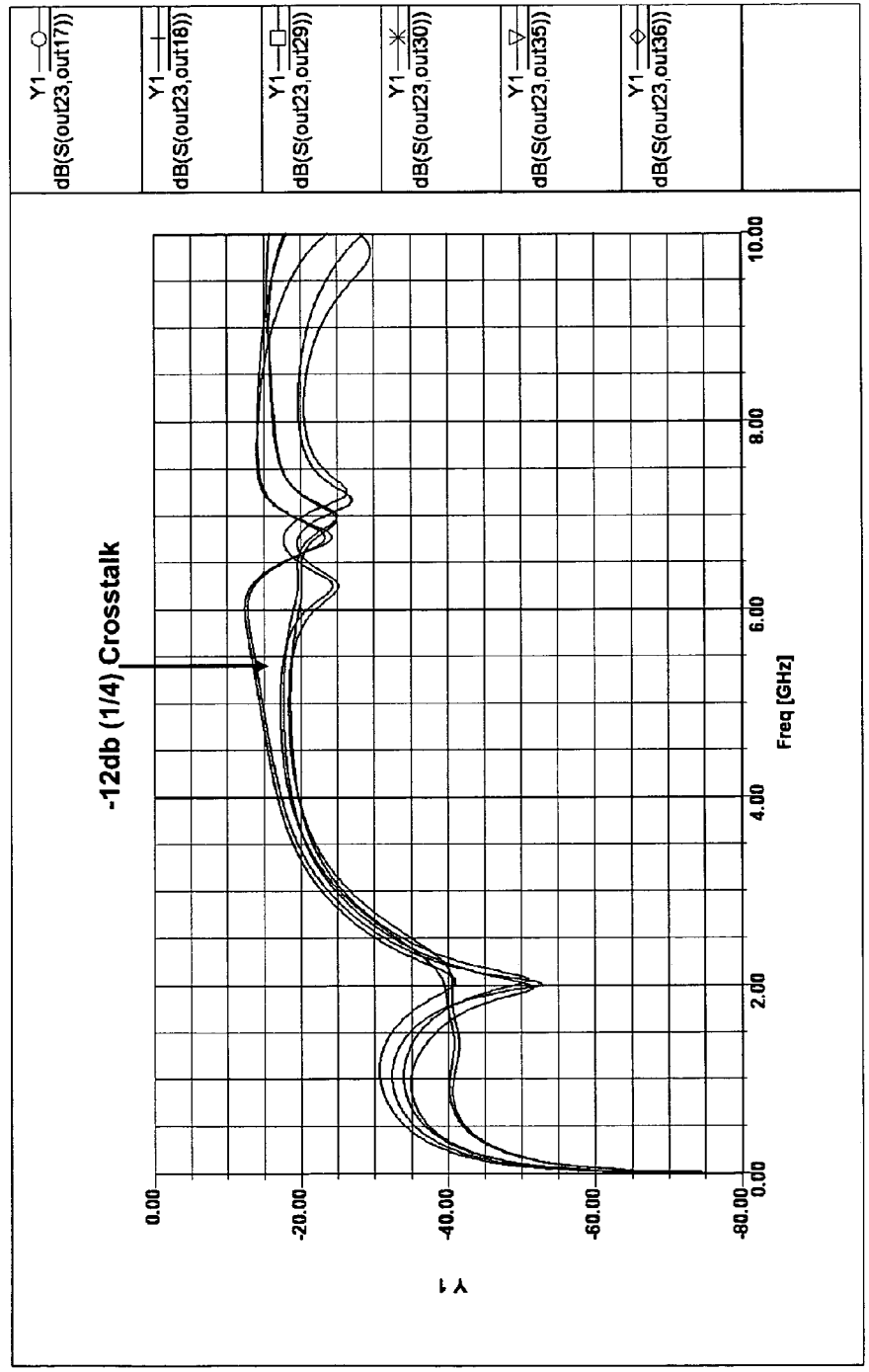
FIG. 2 illustrates a prior art graphical representation of a crosstalk response into a signal trace of a BGA package.
Figure 3:
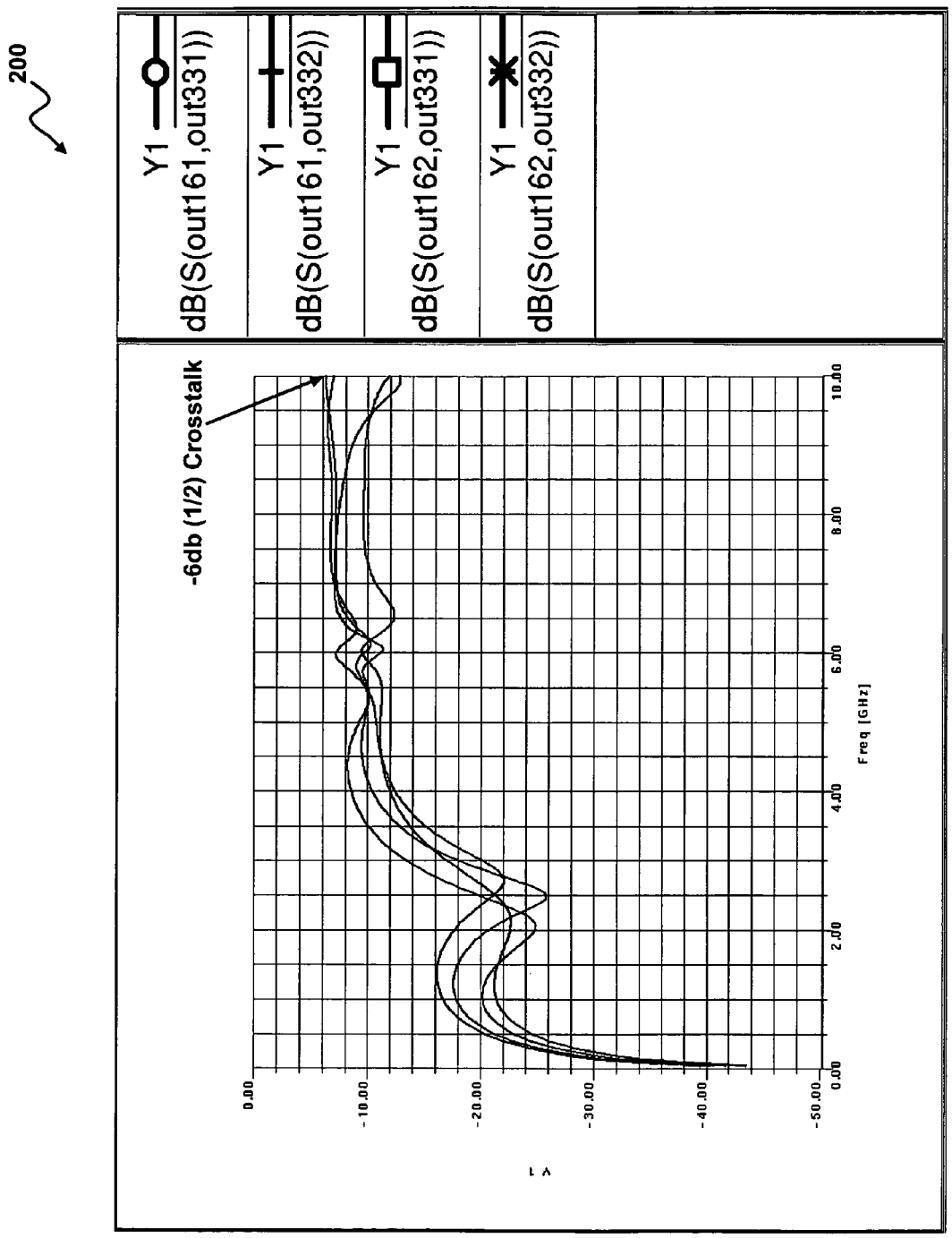
FIG. 3 illustrates another graphical representation of a crosstalk performance of a BGA package.
Figure 5:
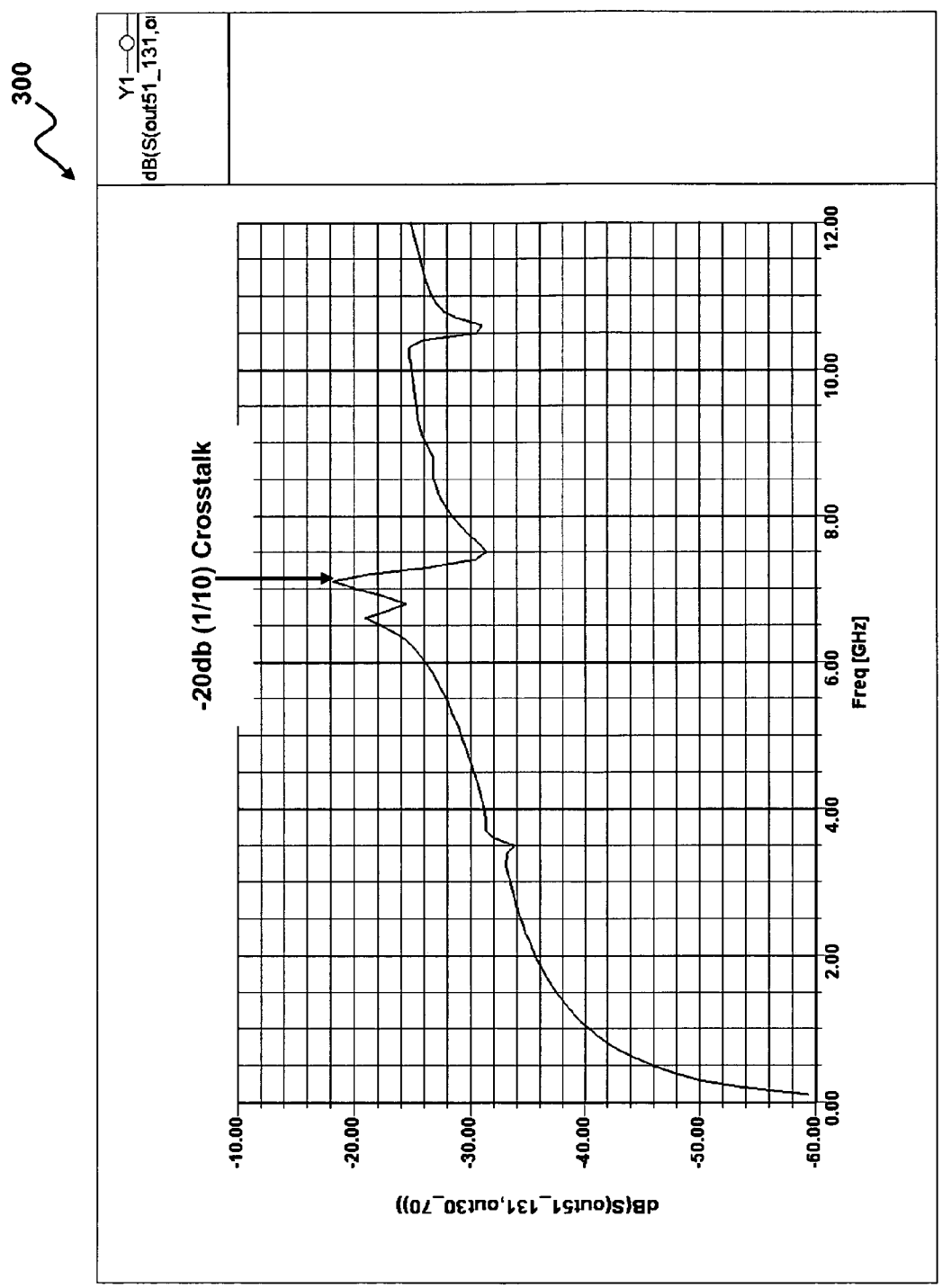
FIG. 5 illustrates a prior art graphical representation of a crosstalk performance of Flip-Chip package.
Figure 10:
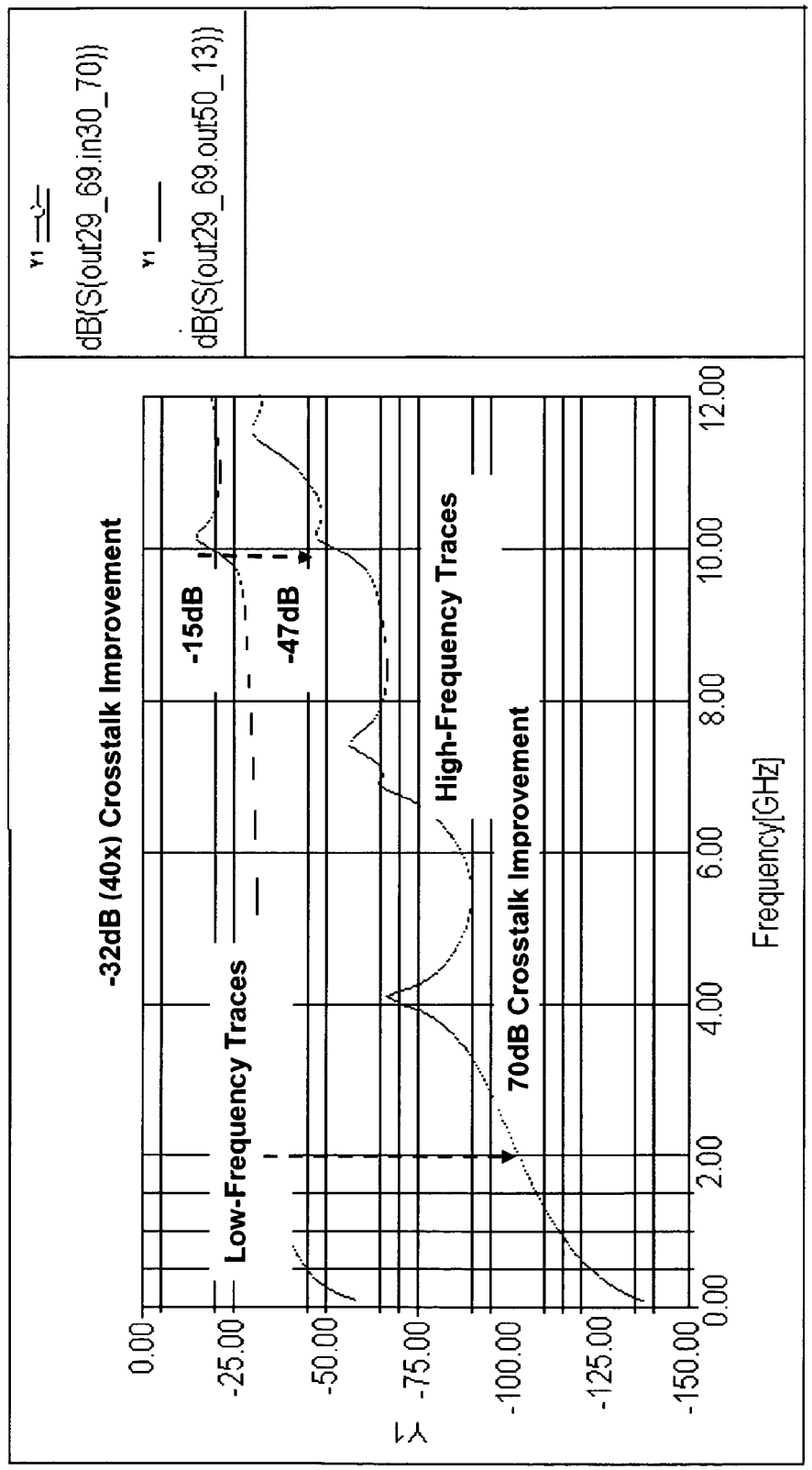
FIG. 10 illustrates a graphic depicting crosstalk improvement in an improved IC package, in accordance with an alternative embodiment.

Referring to FIG. 10, a graph 550 of crosstalk improvement in an improved IC package 400 is illustrated, in accordance with an alternative embodiment. The graph 550 depicted in FIG. 10 illustrates the improved crosstalk performance of the improved IC package 400. As indicated in graph 550 of FIG. 10, the high frequency crosstalk is generally in the range of −47 dB at 10 GHz and the low frequency crosstalk is generally in the range of −103 dB at 2 GHz. This is a significant improvement over the BGA and FC package worst case crosstalk of −12 dB as illustrated in FIG. 2 and −35 dB as illustrated in FIG. 5, respectively. This approach of enclosing the signal pair results in a crosstalk improvement. Such a technique also extends the use of present material packages to a frequency range up to approximately 10 GHz.

Figure 11:
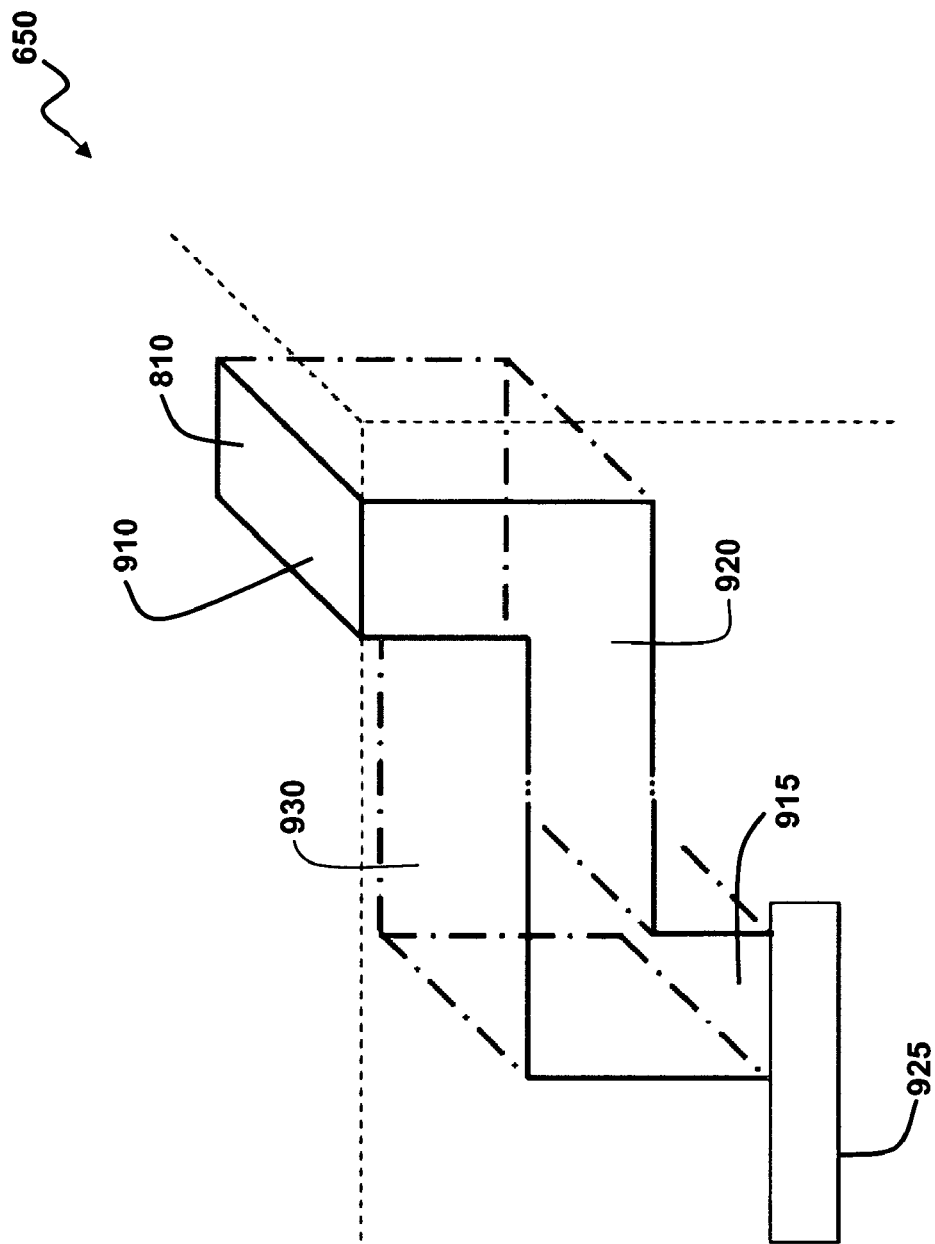
FIG. 11 illustrates the package boundary of an improved IC package which can be implemented, in accordance with an alternative embodiment.

Referring to FIG. 11, the package boundary 650 of an improved IC package 400 is illustrated which can be implemented, in accordance with an alternative embodiment. The IC package interface with the PCB and other system media, can be improved for ever increasing bit rates. For frequency ranges above 10 GHz, the fissure 720 as shown in FIG. 7 can be extended to a variety of other implementations for the I/O transceiver 820 as shown in FIG. 8. The fissure 720 can be configured as a structure made of an optical fiber material without the metal walls. At the chip end 925 the on-chip integrated LED can directly drive the optical fiber interface 810. The fissure 720 can be extended through a PCB 910 edge. This configuration can result in the removal of solder balls 160 shown in FIG. 4 for high speed signal traces 610, utilizing their respective vias 140. The fissure 720 can be constructed as a continuous waveguide 920 with metal boundaries. At the chip end 925 of the IC package 400, the I/O can drive a loop coupling 915. The loop coupling 915 generally serves as an input 925 to the waveguide 920. Exiting the package, the waveguide 920 can join the similar waveguide built on the PCB 910.

Figure 12:
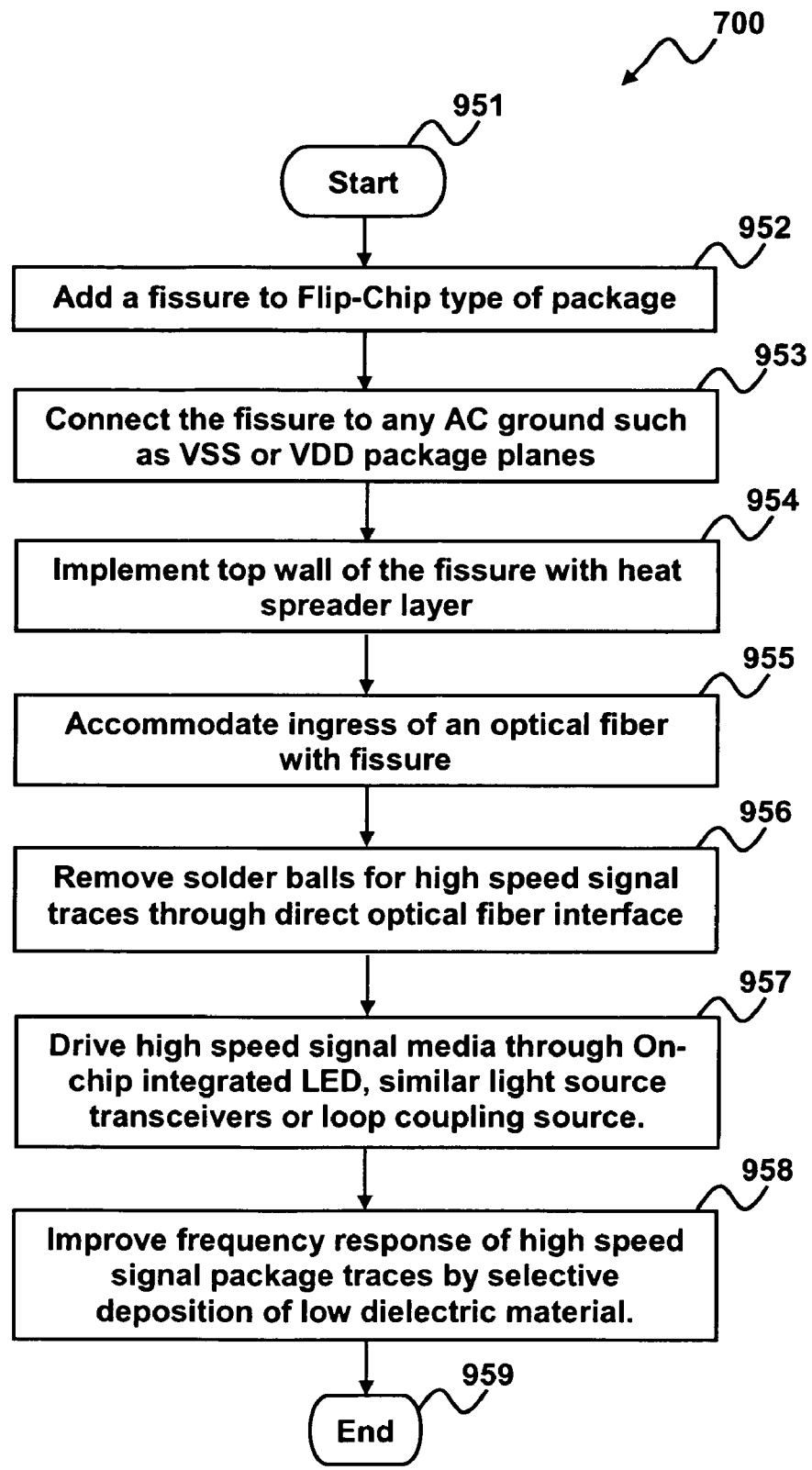
FIG. 12 illustrates a flowchart of operations depicting logical operational steps for enhancing the performance and extending the frequency range of an IC package and system interface, in accordance with an alternative embodiment.

Referring to FIG. 12, a flowchart of operations depicting logical operational steps for enhancing the performance and extending the frequency range of an IC package and system interface 700 is illustrated, in accordance with an alternative embodiment. The process depicted in FIG. 9 can be initiated, as indicated at block 951. A fissure can be added to a Flip-Chip type package, as depicted at block 952. The fissure can be then connected to any AC ground, such as VSS or VDD package planes, as illustrated at block 953. Top wall of the fissure can be implemented with a heat spreader layer, as indicated at block 954.

Thereafter, as depicted at block 955, the fissure can accommodate the ingress of an optical fiber, which promotes a direct interface with the transceivers. The solder balls can then be removed for high speed signal traces through direct optical fiber interface, with their respective vias, as shown at block 956. The high speed signal media can be driven utilizing an on-chip integrated LED or similar light source transceivers, as depicted at block 957. The frequency response of resulting high speed signal package traces can be improved by selective deposition of low $\in_r$ dielectric material, as illustrated at block 958. The process can then terminate, as indicated at block 959.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for enhancing the performance and extending the frequency range of integrated circuit packages, comprising:
   adding a fissure to a Flip-Chip (FC) package in order to improve a cross talk performance of said FC package for high and low frequency ranges;
   thereafter connecting said fissure to an AC ground; and
   configuring a top wall of said fissure utilizing a heat spreader layer in order to form an improved IC package based on said FC package in association with said fissure and said top wall thereof.

2. The method of claim 1, further comprising:
   accommodating an ingress of an optical fiber with said fissure in order to provide for a direct interface of said optical fiber with a transceiver;
   driving a high speed signal trace utilizing an on-chip integrated light emitting device; and
   improving a frequency response of said high speed signal trace by selectively depositing a low dielectric material.

3. The method of claim 2 wherein said light emitting device comprises a light emitting diode (LED).

4. The method of claim 2 wherein said optical fiber permits a removal of at least one solder ball from said high speed signal trace.

5. The method of claim 2 wherein said high speed signal trace comprises said fissure.

6. The method of claim 1 wherein said fissure extends a frequency range of said FC package.

7. The method of claim 1 further comprising:
   forming said fissure utilizing a conductive material in order to connect said fissure to said AC ground.

8. The method of claim 1 further comprising:
   associating a loop coupling with said improved IC package, wherein at least one I/O connected to said improved IC package drives said loop coupling.

9. The method of claim 8 wherein said loop coupling comprises an input to waveguide associated with said improved IC package and wherein said waveguide joins another waveguide which is configured on a PCB.

10. A method for enhancing the performance and extending the frequency range of integrated circuit packages, comprising:
    adding a fissure to a Flip-Chip (FC) package in order to improve a cross talk performance of said FC package for high and low frequency ranges;
    thereafter connecting said fissure to an AC ground;
    configuring a top wall of said fissure utilizing a heat spreader layer;
    accommodating an ingress of an optical fiber with said fissure in order to provide for a direct interface of said optical fiber with a transceiver;
    driving a high speed signal trace utilizing an on-chip integrated light emitting device; and
    improving a frequency response of said high speed signal trace by selectively depositing a low dielectric material in order to form an improved IC package based on said FC package in association with said fissure and said top wall thereof.

11. The method of claim 10 further comprising:
    associating a loop coupling with said improved IC package, wherein at least one I/O connected to said improved IC package drives said loop coupling.

12. The method of claim 11 wherein said loop coupling comprises an input to waveguide associated with said improved IC package and wherein said waveguide joins another waveguide which is configured on a PCB.

* * * * *